United States Patent
Klim et al.

(10) Patent No.: US 7,557,616 B2
(45) Date of Patent: * Jul. 7, 2009

(54) LIMITED SWITCH DYNAMIC LOGIC CELL BASED REGISTER

(75) Inventors: Peter J. Klim, Austin, TX (US); Jethro C. Law, Austin, TX (US); Trong V. Luong, Austin, TX (US); Abraham Matthews, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/172,656

(22) Filed: Jul. 14, 2008

(65) Prior Publication Data

US 2009/0108874 A1 Apr. 30, 2009

Related U.S. Application Data

(63) Continuation of application No. 11/877,898, filed on Oct. 24, 2007, now Pat. No. 7,414,436.

(51) Int. Cl.
*H03K 19/00* (2006.01)

(52) U.S. Cl. .......................... 326/93; 326/98; 326/121

(58) Field of Classification Search ............. 326/93–98, 326/112, 119, 121
See application file for complete search history.

(56) References Cited

U.S. PATENT DOCUMENTS

| 6,023,179 | A | 2/2000 | Klass |
| 6,310,499 | B1 | 10/2001 | Radjassamy |
| 6,693,459 | B2 | 2/2004 | Nedovic et al. |
| 6,809,570 | B2 | 10/2004 | Francom |
| 7,161,390 | B2 | 1/2007 | Aipperspach et al. |
| 2007/0290719 | A1 * | 12/2007 | Qureshi et al. ................ 326/95 |

* cited by examiner

*Primary Examiner*—Don P Le
(74) *Attorney, Agent, or Firm*—Yee & Associates, P.C.; Matthew B. Talpis

(57) ABSTRACT

A circuit that has a limited switch dynamic logic gate having a front end logic circuit and a latch. The output of the front end logic circuit is connected to an input of the latch, and the front end logic circuit evaluates a set of input signals applied to the front end logic circuit to generate an output signal. The latch receives and holds the output signal. The circuit also has a logic circuit having an output connected to a clock input in the front end logic circuit. The logic circuit generates a modified clock signal in response to receiving a clock signal from a clock source, and the modified clock signal has a duration that provides a minimum period of time for the front end logic to evaluate the set of input signals and generate the output signal.

17 Claims, 2 Drawing Sheets

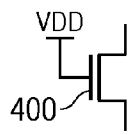
*FIG. 4*
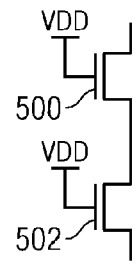
*FIG. 5*
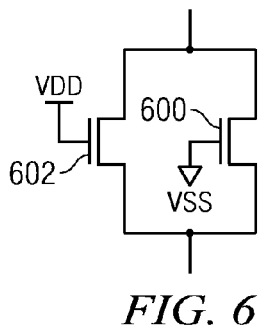
*FIG. 6*
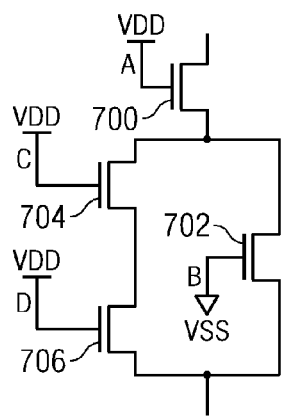
*FIG. 7*
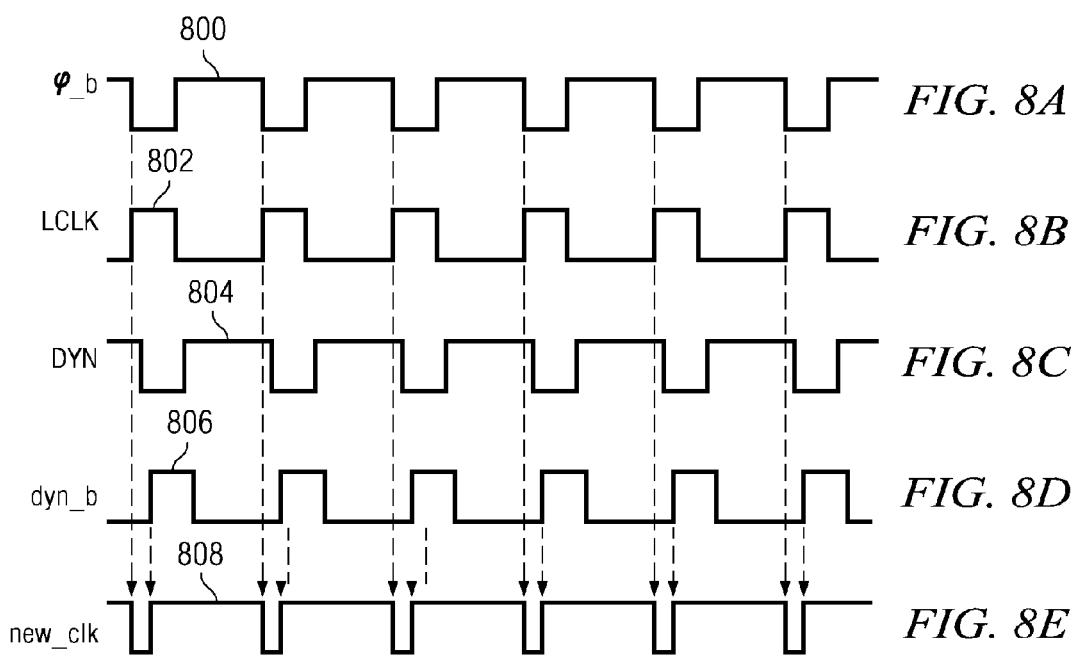
*FIG. 8A*
*FIG. 8B*
*FIG. 8C*
*FIG. 8D*
*FIG. 8E*

LIMITED SWITCH DYNAMIC LOGIC CELL BASED REGISTER

This application is a continuation of application Ser. No. 11/877,898, filed Oct. 24, 2007, status allowed.

BACKGROUND OF THE INVENTION

1. Field of the Invention

The present invention relates generally to electronic circuits in general and in particular to a cell based register. Still more particularly, the present invention relates to a method and apparatus for a limited switch dynamic logic cell based register.

2. Description of the Related Art

High performance designs use ever-increasing clock frequencies to obtain the desired processor performance. Clock power dissipation may depend on the distribution network and the total transistor gate load driven by a clock signal. With each new generation of micro processors, the loads have increased on the clock systems. Currently, loads on the clock systems have turned out to be a dominant source of power consumption for modern processors.

In reducing power consumption, limited switch dynamic logic circuits have been used to reduce the consumption of power in addition to reducing the area needed for circuits. These circuits integrate dynamic logic and latches. Dynamic logic circuits provide two benefits compared to static circuits. These types of circuits proved high switching speed and use a smaller area. Power consumption is the trade off that designers make when implementing designs with dynamic circuits. The goal of a limited switch dynamic logic circuit is to benefit from the performance advantages of dynamic logic without enduring the power penalty. Limited switch dynamic logic circuits mitigate this penalty by adding a latch to the output of a dynamic circuit.

Limited switch dynamic logic gates include two sections. These sections are a dynamic logic style front and a latching mechanism. Even with the use of limited switch dynamic logic based circuits, it is still desirable to minimize the complexity of the designs to reduce the area needed on a chip, as well as reduce the power consumption of the chip.

Thus, it would be advantageous to have an improved method and apparatus for a limited switch dynamic logic circuit in which the area needed for the circuit and the power consumed by the circuit are reduced.

SUMMARY OF THE INVENTION

The illustrative embodiments provide a circuit that has a limited switch dynamic logic gate having a front end logic circuit and a latch. The output of the front end logic circuit is connected to an input of the latch, and the front end logic circuit evaluates a set of input signals applied to the front end logic circuit to generate an output signal. The latch receives and holds the output signal. The circuit also has a logic circuit having an output connected to a clock input in the front end logic circuit. The logic circuit generates a modified clock signal in response to receiving a clock signal from a clock source, and the modified clock signal has a duration that provides a minimum period of time for the front end logic to evaluate the set of input signals and generate the output signal.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 4 is a diagram illustrating a type of logic for a pull down network in accordance with an illustrative embodiment;

FIG. 5 is a diagram illustrating another different type of logic for a pull down network in accordance with an illustrative embodiment;

FIG. 6 is a diagram illustrating an example of a different type of logic for a pull down network in accordance with an illustrative embodiment;

FIG. 7 is a diagram illustrating an example of yet another different type of logic for a pull down network in accordance with an illustrative embodiment; and FIGS. 8A-8E are timing diagrams illustrating different signals in a register system in accordance with an illustrative embodiment.

DETAILED DESCRIPTION OF THE PREFERRED EMBODIMENT

Figure 1:
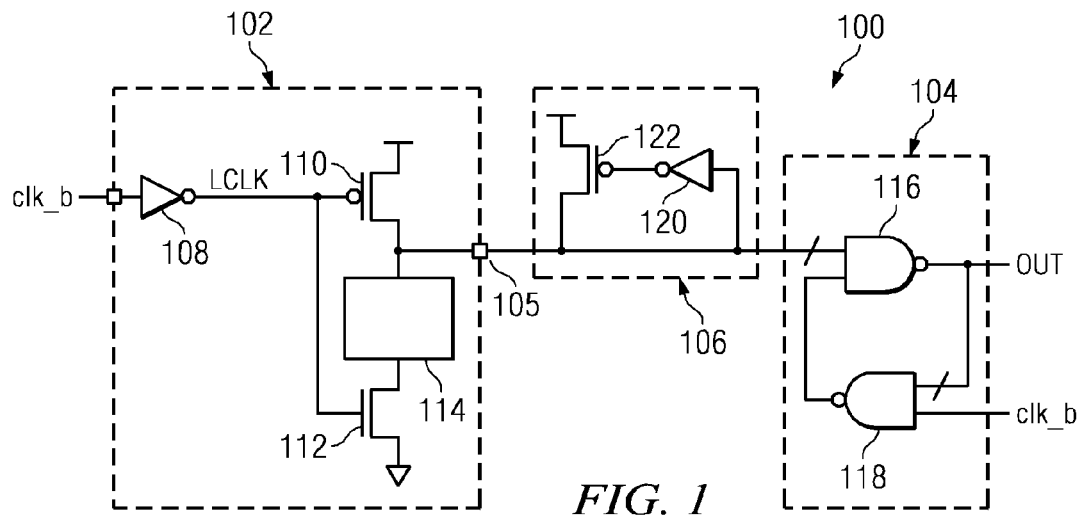
FIG. 1 is a diagram of a conventional limited switch dynamic logic gate.

With reference now to the figures and particularly with reference to FIG. 1, a diagram of a conventional limited switch dynamic logic gate is depicted. In this example, gate 100 contains front end dynamic logic 102, latch 104 and keeper circuit 106. In this particular example, front end dynamic logic 102 contains inverter 108, transistor 110, transistor 112, and pull down network (PDN) 114. In these examples, transistor 110 is a p-channel metal-oxide semiconductor field effect transistor, and transistor 112 is an n-channel metal-oxide semiconductor field effect transistor. Latch 104 is a XNAND latch that is comprised of NAND gate 116 and NAND gate 118. Keeper circuit 106 includes inverter 120 and transistor 122. In these examples, transistor 122 is a p-channel metal-oxide semiconductor field effect transistor.

In dynamic circuits, a keeper, such as keeper circuit 106, is used to prevent charge leakage and provide noise immunity when a pull down network does not discharge during an evaluation phase of the clock signal. If keeper circuit 106 is not present, node 105 floats and is susceptible to noise and leakage. In turn, if the noise and leakage is severe enough, an incorrect output may occur resulting in a logic error. This situation is especially dangerous when the logic is clocked in at a 50/50 duty cycle. A duty cycle is defined as a ratio between a pulse and the period of a regular wave form in these examples.

To avoid or prevent these types of problems, circuit designers have used pulsed clocks, skewing the pre-charge and evaluation times in favor of a longer pre-charge time. Additionally, keeper circuit 106 slows down an evaluation tree or pull down network. In other words, the use of this circuit can lead to less speed in generating an output. During the evaluation of the pull down network, keeper circuit 106 is in contention with pull down network 114 in front end dynamic logic 102. Typically, keeper circuit 106 has a size that is small enough to minimize this effect.

Local clock buffer design is also complex when variable pulse widths are required because of the uniqueness of each limited switch dynamic logic front end. Local clock buffers have been designed to support variable clock pulse widths. These types of circuits, however, also introduce increased area and power consumption.

In recognition of these different issues and factors, the different illustrative embodiments provide a limited switch dynamic logic gate cell that eliminates a keeper circuit, such as keeper circuit 106, in each limited switch dynamic logic cell in a register. In these examples, a limited switch dynamic logic gate also is referred to as a limited switch dynamic logic cell. This terminology is often used when these types of gates are used within a register. Further, the need for a variable pulse width local clock buffer also is eliminated using the different illustrative embodiments. These changes reduce the area needed for design and the power consumption of the design.

The illustrative embodiments provide a circuit that has a limited switch dynamic logic gate having a front end logic circuit and a latch. The output of the front end logic circuit is connected to an input of the latch, and the front end logic circuit evaluates a set of input signals applied to the front end logic circuit to generate an output signal. The set of input signals is one or more input. The latch receives and holds the output signal.

The circuit also has a logic circuit having an output connected to a clock input in the front end logic circuit. The logic circuit generates a modified clock signal in response to receiving a clock signal from a clock source, and the modified clock signal has a duration that provides a minimum period of time for the front end logic circuit to evaluate the set of input signals and generate the output signal. The minimum response time is the smallest amount of time needed by the front end logic circuit in the limited switch dynamic logic gate to evaluate or process the set of input signals to generate the output signal.

In these examples, the logic circuit is a logic circuit used to process a set of input signals to generate a result. This result may be output as an output signal and stored in another circuit, such as a latch. Examples of logic circuits are a front end logic circuit or a domino logic block.

The different illustrative embodiments are directed towards a register. In particular, the register is a register that is based on limited switch dynamic logic cells in which the limited switch dynamic logic cells represent a bit in this register. Typically, such a register includes a local clock buffer and a number of identical limited switch dynamic logic cells. The local clock buffer currently drives two clocks. These clocks are a system clock and a scan clock that are sent to the limited switch dynamic logic cells. In the current designs, the system clock is pulsed. This pulse width is typically much wider than the worst case pull down network of the limited switch dynamic logic cells within the register.

The different illustrative embodiments modify the system clock pulse width such that all the limited switch dynamic logic cells in the register see a clock signal that is just wide enough to pull down the network for evaluation. In other words, the clock signal has a duration or pulse width that provides a minimum period of time needed for the evaluation to be made. By making this modification, a keeper circuit no longer is needed and may be eliminated from the limited switch dynamic logic circuit used in the limited switch dynamic logic cells.

In these illustrative embodiments, a keeper circuit in a limited switch dynamic logic cell, such as keeper circuit 106 in FIG. 1, is unnecessary and is not included in the cell. This component may be removed from the limited switch dynamic logic cell because the different illustrative embodiments provide a system clock with a pulse width that is just long enough to evaluate each cell, but also short enough to avoid or reduce effects from noise and charge leakage.

With the removal of the keeper circuit, the delay of a limited switch dynamic logic cell in a register also is reduced. This reduction in delay provides a speed increase for the cell. Additionally, the amount of area and power required by each limited switch dynamic logic cell in a register also is reduced.

With multiple limited switch dynamic logic cells being used in a register, the savings increase. In these illustrative examples, a minimum clock pulse width generated for evaluation allows for the removal of the keeper circuits because the evaluation window is small enough such that noise and leakage effects cannot harm the logical functionality of the limited switch dynamic logic cell.

Figure 2:
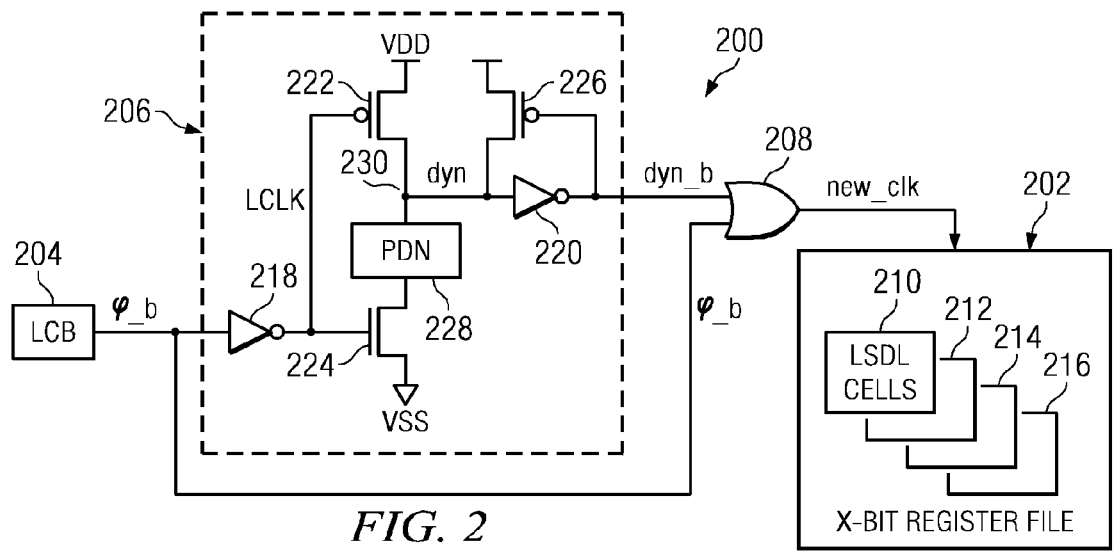
FIG. 2 is a block diagram of a register system using limited switch dynamic logic cells in accordance with an illustrative embodiment.

Turning now to FIG. 2, a block diagram of a register system using limited switch dynamic logic cells is depicted in accordance with an illustrative embodiment. In this example, register system 200 includes register 202, local clock buffer (LCB) 204, domino logic block 206, and OR gate 208. Local clock buffer (LCB) 204 has its output connected to domino logic block 206 and an input to OR gate 208. In turn, domino logic block 206 has its output connected to OR gate 208. The output of OR gate 208 is connected to register 202.

Register 202 is a limited switch dynamic logic cell based register, containing limited switch dynamic logic cells 210, 212, 214, and 216. In this illustrative example, four cells are present, making register 202 a four bit register. Other numbers of limited switch dynamic logic cells may be used depending on the number of bits needed for register 202. For example, if register 202 is designed to be a 64-bit register, 64 of these types of cells are employed within register 202.

In this example, domino logic block 206 contains inverter 218 and inverter 220. Transistors 222 and 224 also are present in domino logic block 206. Transistor 222 is a p-channel metal-oxide semiconductor field effect transistor, while transistor 224 is an n-channel metal-oxide semiconductor field effect transistor in these examples. Additionally, domino logic block 206 also includes transistor 226, which is a p-channel transistor in these examples. The gate of transistor 226 is connected to the output of inverter 220. The source of transistor 226 is connected to upper power supply VDD, while the drain of transistor 226 is connected to the input of inverter 220.

Transistor 224 has its drain connected to pull down network (PDN) 228 and its source connected to lower power supply voltage VSS, which is ground in this example. The output of inverter 218 is connected to the gates of transistors 222 and 224. The output of pull down network 228 and the drain of transistor 222 are connected to the input of inverter 220.

Domino logic block 206 also includes pull down network 228. Pull down network 228 is designed such that when the desired output of this circuit is desired to be low, pull down network 228 is active, creating a current path between the negative supply and the output. In this example, the output of pull down network 228 is connected to inverter 220. Domino logic block 206 is a dynamic logic front end with inverter 220 added.

In these examples, pull down network 228 is also referred to as an evaluation tree. Pull down network 228 contains different logic circuits. In the illustrative embodiments, pull down network 228 is designed to mimic or produce the same evaluation as found in limited switch dynamic logic cells 210, 212, 214, and 216 in register 202. Pull down network 228 contains the same components as these cells when these cells are identical within register 202.

In case that the pull down networks are different between different cells within register 202, pull down network 228 is designed to have the worst case pull down network within the cells. In other words, pull down network 228 is designed to have the slowest evaluation time that is possible for any of limited switch dynamic logic cells 210, 212, 214, and 216 if the pull down networks within those different cells are not the same.

Additionally, pull down network 228 has all of the inputs tied or connected in a manner to produce the slowest evaluation. In other words, pull down network 228 is configured with inputs such that the longest amount of time possible to generate an output in response to evaluating inputs occurs.

This type of design and configuration of pull down network 228 generates a minimum clock width pulse needed by limited switch dynamic logic cells 210, 212, 214, and 216 to provide an output in response to input signals being applied to those cells. This output is signal dyn, which is inverted by inverter 220 to form signal dyn_b.

The output of local clock buffer 204 is connected to the input of inverter 218 in domino logic block 206. Local clock buffer 204 functions as a clock source and generates a clock signal, $\phi$-b, that is sent through domino logic block 206. Additionally, the output of local clock buffer 204 is connected to one of the inputs of OR gate 208. The output of domino logic block 206 is sent through inverter 220 into the input of OR gate 208. The signal $\phi\_b$ sent into OR gate 208 is used to pull down the output of OR gate 208 when signal $\phi\_b$ transitions to a logic zero.

The output of OR gate 208 generates a new clock signal, new_clk, which is sent to register 202. The output of OR gate 208 is a new clock signal, which has a minimum clock pulse width needed for limited switch dynamic logic cells 210, 212, 214, and 216 in register 202 to generate an output in response to evaluating an input signal applied to these cells.

The use of OR gate 208 in conjunction with local clock buffer 204 and domino logic block 206 avoids the need for a keeper circuit as in currently used systems. In other words, the output of OR gate 208 becomes the clock signal used to drive limited switch dynamic logic cells 210, 212, 214, and 216 in register 202.

When inverter 218 receives clock signal $\phi\_b$, inverter 218 generates the signal lclk at its output. This signal is applied to transistors 222 and 224. The output of pull down network 228 is generated at node 230 in this particular example. This output is signal dyn. This signal is sent into inverter 220 which generates signal dyn_b. The output of inverter 220 is connected to the input of OR gate 208.

In these examples, pull down network 228 is designed based on a tallest end channel field effect transistor stack in the limited switch dynamic logic cells within register 202 that are to be driven by the clock signal. This design guarantees the slowest evaluation time for each of the limited switch dynamic logic cells in register 202. As a result, a window is established that cuts off the clock pulse feed into the register. All of the inputs into pull down network 228 are tied high such that node 230 discharges every cycle of the clock signal generated by local clock buffer 204. Transistor 224 prevents node 230 from discharging during a pre-charge phase for signal lclk generated by inverter 218.

Figure 3:
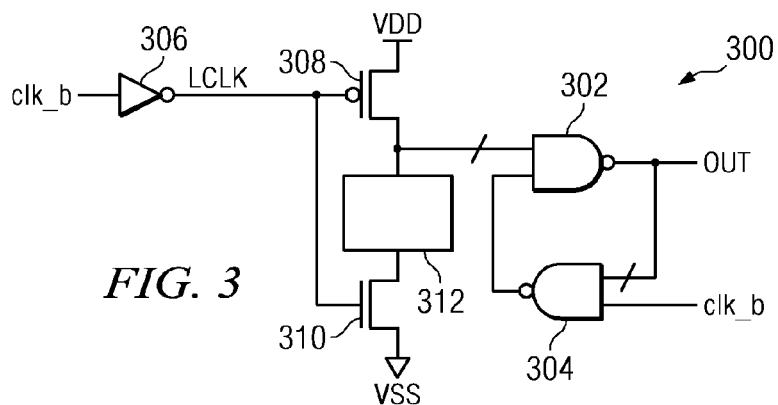
FIG. 3 is a diagram of a limited switch dynamic logic cell in accordance with an illustrative embodiment.

Turning now to FIG. 3, a diagram of a limited switch dynamic logic cell is depicted in accordance with an illustrative embodiment. In this example, limited switch dynamic logic cell 300 is an example of a cell that may be used to implement limited switch dynamic logic cells within register 202 in FIG. 2.

Limited switch dynamic logic cell 300 includes NAND gates 302 and 304. Additionally, limited switch dynamic logic cell 300 contains inverter 306, transistor 308, transistor 310, and pull down network 312. In these examples, transistor 308 is a p-channel metal-oxide semiconductor field effect transistor, while transistor 310 is an n-channel metal-oxide semiconductor field effect transistor.

The output of inverter 306 is connected to the gates of transistor 308 and transistor 310. Transistor 308 has its source connected to an upper power supply voltage VDD and its drain connected to pull down network 312. Transistor 310 has its drain connected to pull down network 312 and its source connected to lower power supply voltage VSS, which is a ground voltage in these examples. The output of pull down network 312 and the drain of transistor 308 are connected to an input of NAND gate 302. NAND gate 302 has its other input connected to the output of NAND gate 304. The output of NAND gate 302 provides an output for limited switch dynamic logic cell 300. Additionally, this output is connected to the input of NAND gate 304. The other input of NAND gate 304 is connected to a clk_b signal. Transistor 308 has its source connected to an upper power supply voltage VDD. The drain of transistor 308 is connected to n-tree 312, which is a logic circuit that generates an output in response to a set of one or more inputs.

With reference next to FIGS. 4-7, diagrams illustrating different types of logic for a pull down network is depicted in accordance with an illustrative embodiment. The different types of logic illustrated in these figures are examples of logic circuits or blocks that may be used to implement pull down network 228 in FIG. 2.

In FIG. 4, transistor 400 takes the form of an n-channel metal-oxide field effect transistor and is used to form a buffer for a pull down network. The gate of transistor 400 is tied to an upper power supply VDD in these examples.

Next, in FIG. 5, transistors 500 and 502 form a NAND gate. In these examples, transistors 500 and 502 are n-channel metal-oxide field effect transistors with their gates tied to an upper power supply voltage VDD.

Turning now to FIG. 6, transistors 600 and 602 are n-channel metal-oxide field effect transistors configured to form a NOR gate for a pull down network. In these examples, transistor 602 has its gate tied to upper power supply voltage VDD and transistor 600 has its gate tied to low power supply voltage VSS.

With respect to FIG. 7, transistors A 700, B 702, C 704 and D 706 form a complex pull down network. The gates of transistor A 700, transistor C 704, and transistor D 706 are tied to an upper power supply voltage VDD, while the gate of transistor B 702 is tied to low power supply voltage VSS. The output of this complex pull down network is $\overline{A(B+\overline{CD})}$.

Of course, the logic used in a pull down network, such as pull down network 228 in FIG. 2 may take various forms depending on the particular implementation. The particular form depends on the pull down network used in the limited switch dynamic logic cells. The configurations of the inputs in FIGS. 4-7 are selected such that these logic circuits provide the slowest evaluation time. In other words, the inputs are selected such that the longest amount of time possible occurs in generating an output in response to the inputs.

Turning now to FIGS. 8A-8E, timing diagrams illustrating different signals in a register system are depicted in accordance with an illustrative embodiment. Signal 800 in FIG. 8A is a wave form illustrating the output $\phi$-b, of a local clock buffer, such as local clock buffer 204 in FIG. 2. Signal 802 in FIG. 8B is a wave form for a local clock signal lclk generated by an inverter in a domino logic block, such as inverter 218 in domino logic block 206 in FIG. 2.

Signal 804 FIG. 8C is an example of a signal dyn generated at a node, such as node 230 in FIG. 2. Wave form 806 FIG. 8D illustrates an output signal dyn_b generated by a domino logic block. In particular, signal 806 is generated by an inverter, such as inverter 220 in domino logic block 206 in FIG. 2.

Signal 808 in FIG. 8E is an example of a clock signal used to drive limited switch dynamic logic cells. In this example, clock signal 808 is signal new_clk generated by OR gate 208 in FIG. 2. As can be seen in these examples, the system clock generated by the local clock buffer feeds into a domino logic block. The inversion of signal 800 by an inverter in a domino logic block generates signal 802. Signal 802 goes to a high state during the evaluation phase. As a result, the signal at node 230 in FIG. 2 begins to discharge after signal 802 reaches a high state. Signal 804 is flipped by an inverter to generate signal 806. Signal 806 is then logically "ORed" with signal 800 to generate signal 808. This new clock signal in signal 808 is fed into the registers and has a significantly shorter pulse width than the original clock signal generated by the local clock buffer.

In this manner, the different illustrative embodiments provide limited switch dynamic logic circuits that do not require keeper circuits. This ability is provided through the use of a dynamic logic front end circuit having a logic unit, such as a pull down network, that has an evaluation time that is as long as the longest evaluation time generated by a pull down network in a limited switch dynamic logic cell.

If multiple limited switch dynamic logic cells are present with different types of logic units, the logic unit used to generate the clock signal is designed to have the slowest evaluation time of the different logic units used in the limited switch dynamic logic cells. Although, in the depicted examples, pull down networks are illustrated, any type of logic unit may be implemented or used in addition to pull down network 228 in FIG. 2. Further, without needing a keeper circuit, latency is reduced and the limited switch dynamic logic cells in a register are faster.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A circuit comprising:
    a limited switch dynamic logic gate having a front end logic circuit and a latch, wherein when an output of the front end logic circuit is connected to an input of the latch, the front end logic circuit evaluates a set of input signals applied to the front end logic circuit to generate an output signal and the latch receives and holds the output signal; and
    a logic circuit having an output connected to a clock input in the front end logic circuit, wherein the logic circuit generates a modified clock signal in response to receiving a clock signal from a clock source and wherein the modified clock signal has a duration that provides a minimum period of time for the front end logic circuit to evaluate the set of input signals and generate the output signal.

2. The circuit of claim 1, wherein the output of the logic circuit is connected to the clock input of the front end logic circuit through an OR gate, wherein the output of the logic circuit is connected to a first input of the OR gate and the clock source is connected to a second input of the OR gate, and an output of the OR gate is connected to the clock input in the front end logic circuit.

3. The circuit of claim 1, wherein the duration of the modified clock signal reduces noise effects on the limited switch dynamic logic circuit.

4. The circuit of claim 1, wherein the output of the logic circuit is connected to the clock input in the front end logic circuit through an OR gate and wherein the OR gate has a first input connected to the output of the logic circuit, a second input connected to the clock source, and an output connected to the clock input in the front end logic circuit in the limited switch dynamic logic gate.

5. The circuit of claim 1 further comprising:
    a local clock buffer, wherein the local clock buffer is the clock source.

6. The circuit of claim 1, wherein the logic circuit is domino logic block.

7. The circuit of claim 1, wherein the logic circuit comprises:
    a first inverter having an input connected to the clock source;
    a first transistor having a first source/drain connected to an upper power supply voltage, a second source/drain, and a gate connected to an output of the inverter;
    a second transistor having a first source/drain connected to a lower power supply voltage and a second source/drain, and a gate connected to the output of the inverter;
    a pull down network having a first connection to the second source/drain of the first transistor and a second connection to the second source/drain of the second transistor; and
    a second inverter having an input connected to the first connection and an output that is the output of the logic circuit.

8. The circuit of claim 1, wherein the first transistor is a p-channel metal-oxide semiconductor field effect transistor and the second transistor is an n-channel metal-oxide semiconductor field effect transistor.

9. The circuit of claim 1, wherein the logic circuit comprises a pull down network.

10. The circuit of claim 9, wherein the pull down network is configured to have a slowest possible evaluation time to generate an output in response to a set of inputs.

11. A register system comprising:
   a domino logic block having an input connected to a clock source and an output that generates a modified signal from a signal originating from the clock source, wherein the modified signal has a pulse width;
   a plurality of limited switch dynamic logic cells, wherein each limited switch dynamic logic cell in the plurality of limited switch dynamic logic cells has a pull down network having an output connected to an input of a latch and wherein a minimum period of time required by the pull down network to evaluate an input signal is provided by the modified signal with the pulse width; and
   an OR gate, wherein the OR gate has a first input connected to the output of the dynamic logic circuit, a second input connected to the clock source, and an output that generates a clock signal.

12. The register system of claim 11 further comprising:
   a local clock buffer, wherein the local clock buffer generates the signal and is the clock source.

13. The register system of claim 11, wherein the different types of pull down networks are present in the plurality limited switch dynamic logic cells.

14. The register system of claim 11, wherein the pulse width for the modified signal has a width that is sufficient for a particular pull down network in the plurality of limited switch dynamic logic cells having a longest minimum period of time needed to evaluate the input signal with respect to other pull down networks in the plurality of limited switch dynamic logic cells.

15. The register system of claim 11, wherein each of the plurality of limited switch dynamic logic cells represents a bit in the register circuit.

16. The register system of claim 11, wherein the pull down network in each of the plurality of limited switch dynamic logic cells are identical in design.

17. The register system of claim 11, wherein the pull down network is a NAND gate.

* * * * *